United States Patent
Akamine et al.

(10) Patent No.: US 6,919,762 B2
(45) Date of Patent: Jul. 19, 2005

(54) HIGH FREQUENCY POWER AMPLIFIER ELECTRIC PARTS AND RADIO TELECOMMUNICATION SYSTEM

(75) Inventors: Hitoshi Akamine, Maebashi (JP); Kyoichi Takahashi, Fujioka (JP); Masahiro Tsuchiya, Komoro (JP)

(73) Assignee: Renesas Technology Corp., Tokyo (JP)

( * ) Notice: Subject to any disclaimer, the term of this patent is extended or adjusted under 35 U.S.C. 154(b) by 45 days.

(21) Appl. No.: 10/722,532

(22) Filed: Nov. 28, 2003

(65) Prior Publication Data

US 2004/0108902 A1 Jun. 10, 2004

(30) Foreign Application Priority Data

Dec. 10, 2002 (JP) .................................. 2002-357864

(51) Int. Cl.[7] .............................................. H03G 5/16
(52) U.S. Cl. ................................... 330/133; 330/127
(58) Field of Search ................................ 330/133, 127

(56) References Cited

U.S. PATENT DOCUMENTS

| | | | | |
|---|---|---|---|---|
| 5,442,322 A | * | 8/1995 | Kornfeld et al. | ............ 330/285 |
| 5,942,946 A | * | 8/1999 | Su et al. | ............ 330/310 |
| 6,265,943 B1 | | 7/2001 | Dening et al. | |
| 6,463,267 B1 | | 10/2002 | Akamine et al. | |
| 6,753,735 B2 | * | 6/2004 | Arai et al. | ............ 330/297 |
| 6,822,511 B1 | * | 11/2004 | Doherty et al. | ............ 330/133 |
| 2002/0146993 A1 | * | 10/2002 | Persico et al. | ............ 455/126 |

FOREIGN PATENT DOCUMENTS

JP           2001-7657           1/2001

* cited by examiner

*Primary Examiner*—Patricia Nguyen
(74) *Attorney, Agent, or Firm*—Mattingly, Stanger, Malur & Brundidge, P.C.

(57) ABSTRACT

The present invention provides a high frequency power amplifier of a multi-stage configuration in which a plurality of transistors for power amplification are cascaded, with reduced distortion of a signal in a region where an output power level is low and improved power efficiency. In a high frequency power amplifier electric part in which a plurality of transistors for power amplification are cascaded, a transistor for output level detection is provided whose gate terminal receives a gate input of a transistor for power amplification in the final stage via a resistive element of which resistance value is 100 Ω or less. Current detected by the transistor is converted to voltage. The voltage is compared with output control voltage by an error amplifier. Voltage according to the potential difference is applied to the gate terminals of the transistors for power amplification in the amplification stages to thereby pass idle current.

11 Claims, 9 Drawing Sheets

HIGH FREQUENCY POWER AMPLIFIER ELECTRIC PARTS AND RADIO TELECOMMUNICATION SYSTEM

BACKGROUND OF THE INVENTION

The present invention relates to a technique effectively applied to a high frequency power amplifier for use in a radio telecommunication system such as a portable telephone and for amplifying a high frequency signal and outputting an amplified signal, and to an electric part in which the high frequency power amplifier is assembled. More particularly, the invention relates to a technique for improving power efficiency by reducing distortion in a signal in a region where an output power is low in a radio telecommunication system for detecting an output level necessary for a feedback control of an output power by a current detecting method, sending a feedback signal to each of amplification stages of a high frequency power amplifier having a multi-stage configuration in accordance with the detected output level, and controlling a bias.

Generally, in a transmission part of a radio telecommunication apparatus (mobile telecommunication apparatus) such as a portable telephone, a modulation circuit for modulating a transmission signal and a high frequency power amplifier for amplifying the modulated signal are assembled. In a conventional radio telecommunication apparatus, to control the amplification factor of the high frequency power amplifier in accordance with a requested output level from a baseband circuit or a control circuit such as a microprocessor, the level of an output power of an antenna is detected and is fed back (for example, Japanese Unexamined Patent Application No. 2001-7657). Hitherto, the output power level is generally detected by using a coupler, a detector, or the like.

The high frequency power amplifier in a conventional radio telecommunication apparatus has a configuration in which a plurality of transistors for power amplification are connected in a number of stages (generally, three stages). The amplification factor of the high frequency power amplifier is controlled by, as shown in FIG. 8, applying voltages Vg1, Vg2, and Vg3 obtained by dividing an output control voltage Vapc by resistors R11 to R19 to gate terminals of transistors Q1 to Q3 (base terminals in bipolar transistors) in the amplification stages of the high frequency power amplifier.

SUMMARY OF THE INVENTION

In the conventional system in which bias voltages of amplification stages are applied by dividing voltage with resistors, generally, the ratio of resistors R11 to R19 for generating the gate bias voltages Vg1 to Vg3 are set so that the amplification factor of the transistors Q1 to Q3 of the amplification stages becomes the ratio optimum to make the power efficiency excellent at the time of maximum output power. Concretely, as shown in FIG. 9, the gate bias voltages Vg1 and Vg2 in the first and second stages are almost equalized though Vg1 is slightly higher, and the gate bias voltage Vg3 in the final stage is set to be higher than the gate bias voltages Vg1 and Vg2 in the first and second stages. In the conventional system in which bias voltages in the amplification stages are applied by division of voltage with the resistors, the gate bias voltages Vg1 to Vg3 change in proportion to the output control voltage Vapc in a region lower than the maximum output power.

In the high frequency power amplifier of a multi-stage configuration, however, in the case of changing the bias voltages Vg1 to Vg3 in the stages in proportion to the output control voltage Vapc, idle currents (drain currents when an input signal Pin is not supplied) flowing into amplification transistors in the stages change exponentially as shown in FIG. 10. It was understood that when the ratio of the gate bias voltages Vg1 to Vg3 is set so that the amplification factors of the transistors Q1 to Q3 in the amplification stages become the optimum ratio at the time of the maximum output power, the idle currents Idd1 and Idd2 become very small in a region where the output power is low, distortion of the signal increases and, in addition, power efficiency deteriorates.

An object of the invention is to improve power efficiency by reducing distortion of a signal by making an idle current sufficiently flow into a transistor for amplification in a stage which is preceding the final stage also in a region where an output power level is low in a high frequency power amplifier of a multi-stage configuration in which a plurality of transistors for power amplification are cascaded.

Another object of the invention is to provide a high frequency power amplifier electric part as a component of a radio telecommunication system for detecting an output level necessary to perform feedback control of an output power by a current detection method, in which by feeding back the power to each of the amplification stages in consideration of not only a DC component but also an AC component of the output, idle current of the transistors in the amplification stages can be properly distributed to a region where a requested output level is low and a region where the requested output level is high. In such a manner, distortion of a signal is reduced, and power efficiency is improved.

Further another object of the invention is to provide a high frequency power amplifier electric part as a component of a radio telecommunication system for detecting an output level necessary to perform feedback control of an output power by a current detection method, in which by passing idle current proportional to idle current of a transistor in a final stage to a transistor in a preceding stage, without deteriorating the characteristics in a region where the output power level is high, distortion in a signal in a region where the output power level is low is reduced, and power efficiency is improved.

The above and other objects and novel features of the invention will become apparent from the description of the specification and the appended drawings.

An outline of a typical one of the inventions disclosed in the specification will be described as follows.

In a high frequency power amplifier electric part in which a plurality of transistors for power amplification are cascaded, a transistor for output level detection is provided whose gate terminal receives a gate input of a transistor for power amplification in the final stage via a resistive element of which resistance value is 100 Ω or less, preferably, 50 Ω or less. Current detected by the transistor is converted to voltage. The voltage is compared with output control voltage by an error amplifier. Voltage according to the potential difference is applied to the gate terminals of the transistors for power amplification in the amplification stages to thereby pass idle current.

According to the means, since the resistance value of the resistive element provided between the gate terminal of the transistor for power amplification in the final stage and the gate terminal of the transistor for output level detection is set to a small value such as 100 Ω or less, not only a DC component but also an AC component of a signal which is input to the gate of the transistor for power amplification in the final stage are transmitted to the gate terminal of the transistor for output level detection. Thus, a signal including the AC component can be fed back. As compared with the case of detecting only a DC component and feeding it back, current flowing in the amplification stage on the first stage side can be increased in a region of a low output level. As a result, distortion of a signal can be reduced and power efficiency can be improved.

Desirably, an output of the error amplifier for amplifying the potential difference between the voltage detected by the transistor for output level detection and the output control voltage is fed back to the gate input side of the transistor for power amplification in the final stage. An error amplifier different from the above-described error amplifier is provided. The output voltage of the error amplifier for the final stage is input as a reference voltage to the error amplifier. The gate input voltage of a transistor for power amplification in a preceding stage is input as another comparison voltage to the error amplifier. A voltage according to the potential difference is fed back to the gate input side of the transistor for power amplification in a preceding stage. With the configuration, accurate idle current proportional to the idle current of the transistor for power amplification in the final stage is made to pass to the transistor for power amplification in the preceding stage irrespective of variations in manufacture.

DETAILED DESCRIPTION OF THE PREFERRED EMBODIMENTS OF THE INVENTION

Preferred embodiments of the invention will be described hereinbelow with reference to the drawings.

Figure 1:
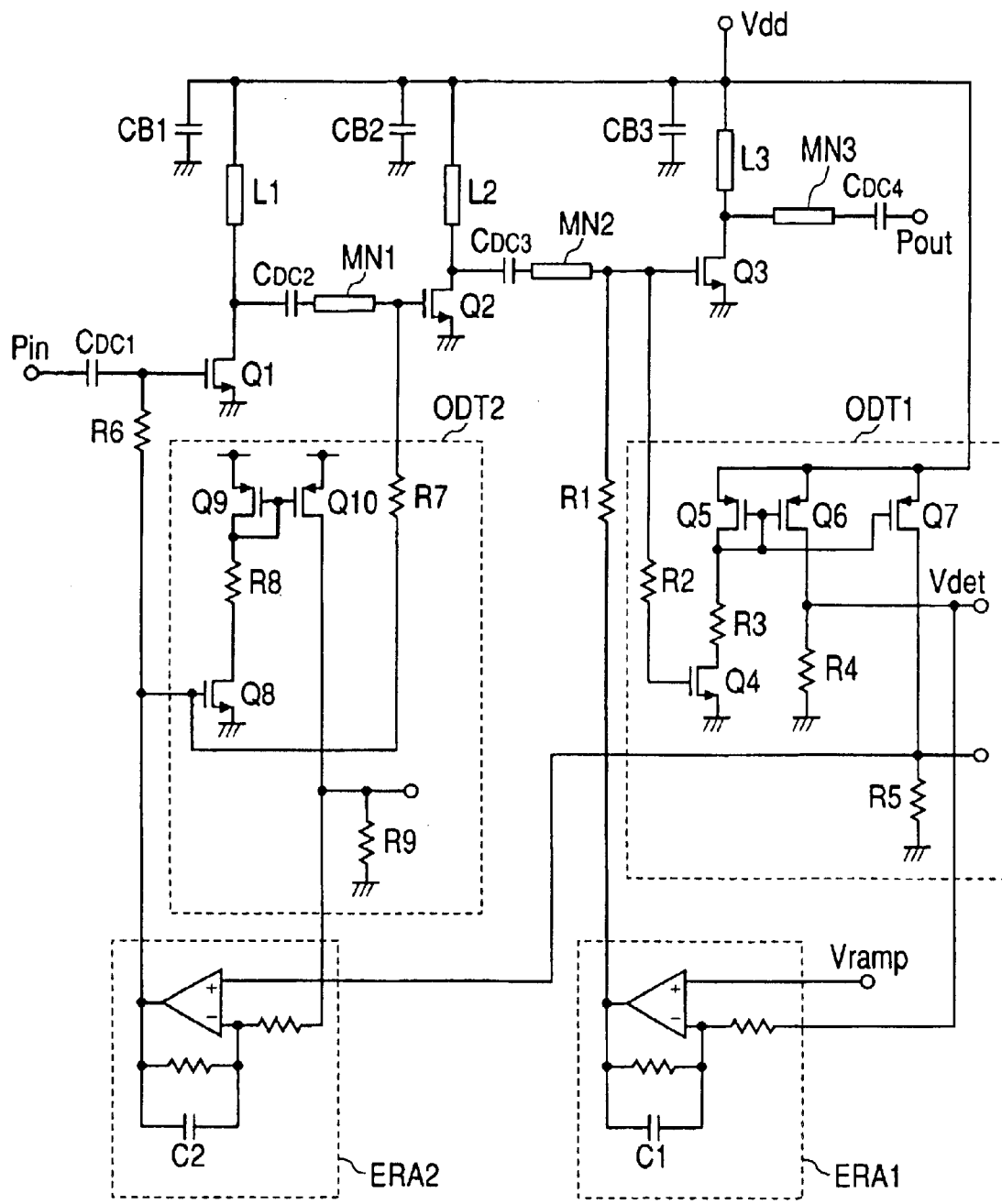
FIG. 1 is a circuit diagram showing a first embodiment of a high frequency power amplifier and a bias generating circuit to which the invention is applied.

FIG. 1 shows a first embodiment of a high frequency power amplifier (hereinbelow, called power amplifier) and a bias generating circuit to which the invention is applied.

Shown in FIG. 1 are a transistor Q1 for power amplification constructing a first amplification stage for amplifying an input high frequency signal Pin, a transistor Q2 for power amplification constructing a second amplification stage, having a gate terminal to which drain voltage of the transistor Q1 is applied, a transistor Q3 for power amplification constructing a final amplification stage, having a gate terminal to which drain voltage is applied, inductance elements L1 to L3 connected between a power source voltage terminal Vdd and the drain terminals of the transistors Q1 to Q3 for power amplification in the amplification stages, impedance matching circuits MN1 to MN3 connected between the transistors for power amplification in the adjacent stages, and capacitive elements CDC1 to CDC4 for blocking DC components.

As the transistors Q1 to Q3 for power amplification, MOSFETs are used in the embodiment of FIG. 1. Other transistors may be used such as bipolar transistors, GaAs MESFET, heterojunction bipolar transistors (HBT), HEMT (High Electron Mobility Transistor), and the like. Each of the impedance matching circuits MN1 to MN3 is constructed by a transmission line and a capacitive element connected between a predetermined position in the transmission line and a ground point. As each of the inductance elements L1 to L3, a λ/4 transmission line having electric length of ¼ wavelength of a fundamental wave can be used.

Also shown in FIG. 1 are a transistor Q4 for detecting output level constructed by a MOSFET having a gate terminal to which the same signal as that of the transistor Q3 for power amplification in the final amplification stage is applied via a resistor R2, a transistor Q5 for a current mirror connected in series with the transistor Q4 via a resistor R3, a transistor Q6 connected to the transistor Q4 so as to form a current mirror, and a sense resistor R4 for current-voltage conversion, which is connected between the drain terminal of the transistor Q6 and the ground point.

In the embodiment, a transistor Q7 for a second current mirror, having a common gate with the transistor Q4, and a resistor R5 for current-voltage conversion which is connected between the drain terminal of the transistor Q7 and the ground point are provided. By the transistors Q4 to Q7 and the resistors R2 to R5, an output level detection circuit ODT1 of current detection type is constructed. Since resistors having relatively high precision are necessary as the resistors R4 and R5 out of thee resistors R2 to R5, external devices are used as the resistors R4 and R5.

The transistor Q4 for detecting output level is formed in a size of a factor of tens to hundreds of the transistor Q3 for power amplification and it is designed so that when the drain current Idd of the transistor Q3 for power amplification is a few A (ampere), the current of the transistor Q4 becomes a few mA to tens mA. The size ratio between the transistor Q4 for detecting output level and the transistor Q5 for current mirror is determined in accordance with the difference between mutual conductance of an N-MOS and mutual conductance of a P-MOS. In the embodiment, the size ratio between the transistors Q5 and Q6 for current mirror (the ratio of gate widths when the gate lengths are equal) is almost 1:1.

With the configuration, current flowing to the transistor Q6 of the output level detection circuit ODT1 is a value (a value determined by the ratio between the transistors Q3 and Q4) which is much smaller than the drain current Idd of the transistor Q3 for power amplification. Since the current flowing to thee transistor Q6 is made to flow to the sense resistor R4, a detection voltage Vdet transformed by the sense resistor R4 becomes a voltage having correlation with output power of the transistor Q3 for power amplification. The transistors Q6 and Q7 are set to have a size ratio such as 1:1 or a size ratio such as n:1 (n>1).

The voltage Vdet detected by the output level detection circuit ODT1 is supplied to an error amplifier ERA1 and is compared with a signal Vramp indicative of an output level supplied from a control circuit such as a microprocessor or the like. A voltage according to the potential difference between Vdet and Vramp is output from the error amplifier ERA1 and is applied as a bias voltage to the gate terminal of the transistor Q3 for power amplification in the final stage via a resistor R1. A node to which an output of the error amplifier ERA1 is fed back is not limited to the gate terminal of the transistor Q3 for power amplification but may be a connection node between a transmission line and a capacitive element in the impedance matching circuit MN2, or a connection node between the capacitive element CDC3 for blocking DC components and the impedance matching circuit MN2. The value of the resistor R1 is desirably about 1 kΩ.

Further, in the embodiment, a second error amplifier ERA2 having a non-inversion input terminal to which a transformed voltage of the resistor R5 for current-voltage conversion is applied, a detection circuit ODT2 constructed by a current detection transistor Q8 for detecting current of the transistor Q1 for power amplifier in the first stage and a current mirror circuit for passing current proportional to current detected by the transistor Q8, and a resistor R9 for current-voltage conversion for converting detected current to voltage are provided.

A converted voltage of the resistor R9 for current-voltage conversion is input to the inversion input terminal of the second error amplifier ERA2, and voltage according to the potential difference between the converted voltage and voltage converted by the resistor R5 of the output level detection circuit ODT1 is output from the error amplifier ERA2 and is applied to the gate terminal of the transistor Q1 for power amplification in the first stage via a resistor R6, thereby controlling the idle current of the transistor Q1. With the configuration, current of the same magnitude as that flowing in the resistor R5 is made to flow to the resistor R9, and current proportional to the current of the transistor Q4 is made to flow to the transistor Q8. When the size ratio between the transistor Q1 for power amplification and the transistor Q8 for current detection is M:1, current which is M times as large as the current flowing in the transistor Q8 is made to pass to the transistor Q1.

Further, in the embodiment, although not limited, voltage output from the error amplifier ERA2 is applied to the gate terminal of the transistor Q2 for power amplification in the second stage via the resistor R7, and the idle current of the transistor Q2 is also controlled by an output of the error amplifier ERA2. A capacitor C1 provided between the output terminal and the inversion input terminal of the error amplifier ERAL and a capacitor C2 provided between the output terminal and the inversion input terminal of the error amplifier ERA2 are capacitors for compensating phases to prevent oscillation of a feedback loop.

In the bias generating circuit of the embodiment, in the case where the size ratio between the transistors Q6 and Q7 constructing a current mirror circuit is 1:1 and the size ratio between the transistors Q8 and Q4 is also 1:1, the idle current according to the size ratios is made to pass to the transistors Q1, Q2, and Q3 for power amplification. In the case where the size ratio between the transistors Q6 and Q7 is n:1, 1/n of the transistor Q6 is made to pass to the transistor Q7. Consequently, when the size ratio between the transistors Q8 and Q4 is 1:1, idle current according to the size ratio of the transistors Q1, Q2, and Q3 for power amplification and the size ratio between the transistors Q6 and Q7 is made to pass to the transistors Q1, Q2, and Q3. The idle current is made to flow similarly also in the case where the size ratio between the transistors Q4 and Q8 or between the transistors Q10 and Q9 is n:1 instead of setting the size ratio between the transistors Q6 and Q7 to n:1.

That is, by properly setting the size ratio between Q6 and Q7, the size ratio between Q8 and Q4, and the size ratio between Q10 and Q9, current obtained by proportionally reducing the current flowing in the transistor Q3 for power amplification in the final stage at a desired ratio can flow to the transistor Q1 for power amplification in the first stage. To the transistor Q2 for power amplification in the second stage, current according to the ratio between the resistors R6 and R7 is made to pass.

Further, in the embodiment, by setting the resistance value of the resistor R2 connected between the drain terminal of the transistor Q3 for power amplification and the gate terminal of the transistor Q4 for output level detection as a component of the output level detection circuit ODT1 to a small value such as 50 Ω, not only a DC component in an input signal of the transistor Q3 for power amplification in the final stage but also an AC component can be transmitted to the output level detection circuit ODT1 so that the level of DC and AC components can be detected. The resistance value of the resistor R6 is set to about 10 Ω, and it is constructed so that the AC component included in an input of the first stage can be detected by the transistor Q8.

Although 50 Ω is selected as the resistance value of the resistor R4 in the embodiment, the value of the resistor R4 is not limited to 50 Ω. If the value is 100 Ω or less, the DC component of an input of the transistor Q3 can be detected while including the AC component by the transistor Q4. It is sufficient that the value of the resistor R6 is 50 Ω or less. The reason why the resistance value of the resistor R6 is set to be smaller than the resistance value of the resistor R4 is because the amplitude of the input signal of the transistor Q1 is smaller than that of the input signal of the transistor Q3.

Therefore, by applying the embodiment, as compared with the case of detecting only a DC component and controlling the gate bias voltages of the transistors Q1 to Q3 for power amplification by the error amplifier ERA1, more accurate idle current can flow. Moreover, in the embodiment, the size ratio between the transistors Q6 and Q7, the size ratio between the transistors Q4 and Q8, and the size ratio between the transistors Q9 and Q10 are set so that the idle current is made to flow to the transistors Q1, Q2, and Q3 for power amplification at the optimum ratio to obtain the maximum efficiency at the time of maximum output power in accordance with the output level including the AC component detected by the output level detection circuit ODT1.

In this case, the larger the output power is, the larger the AC component of idle current of the transistors Q1 to Q3 for power amplification in the stages is. The larger the output power is, the ratio of the AC component in the idle current flowing to the transistors Q1 and Q2 for power amplification in the first and second stages is relatively higher than that of the AC component of the idle current flowing to the transistor Q3 for power amplification in the final stage. Therefore, in the power amplifier using the bias generation circuit of the embodiment, the size ratio of transistors constructing the bias generation circuit is determined so that the current ratio becomes the optimum at the time of maximum output, the currents flowing to the transistors Q1 and Q2 in the first and second stages can be made relatively large when the output power is small. Distortion of a signal when the output power is small can be reduced, and power efficiency can be improved.

Figure 8:
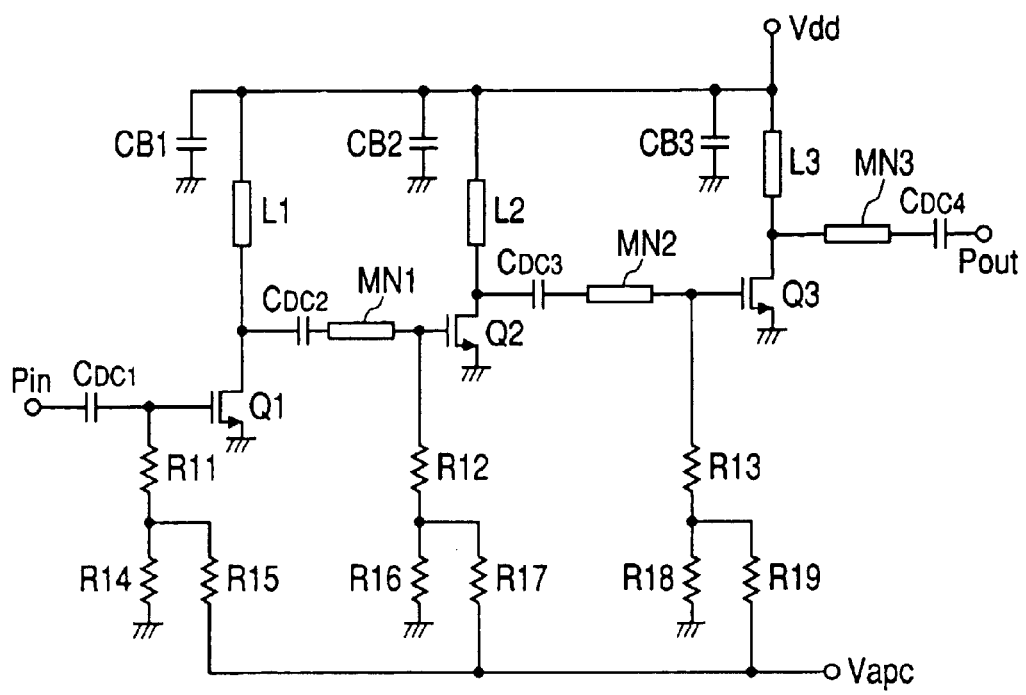
FIG. 8 is a circuit diagram showing an example of the configuration of a conventional high frequency power amplifier and a bias generating circuit.
Figure 9:
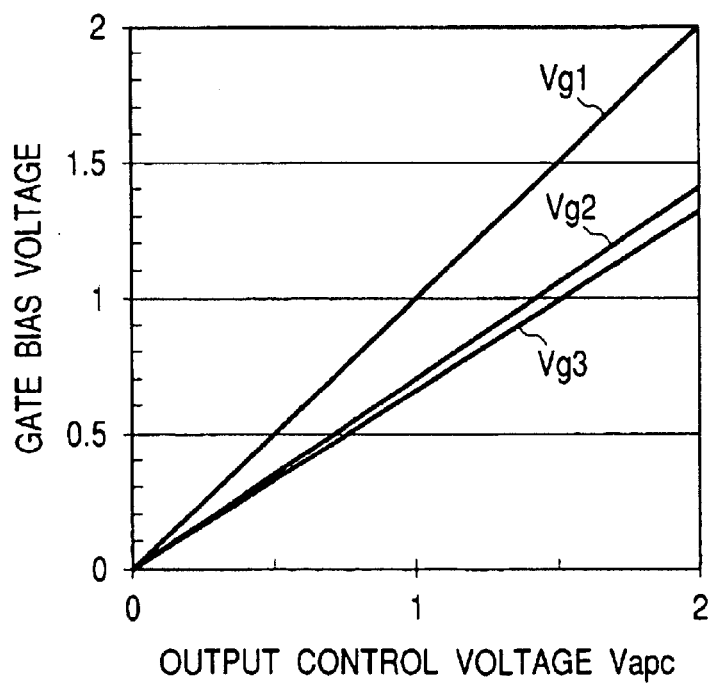
FIG. 9 is a graph showing the relation between output control voltages and bias voltages in the conventional high frequency power amplifier and the bias generating circuit.
Figure 10:
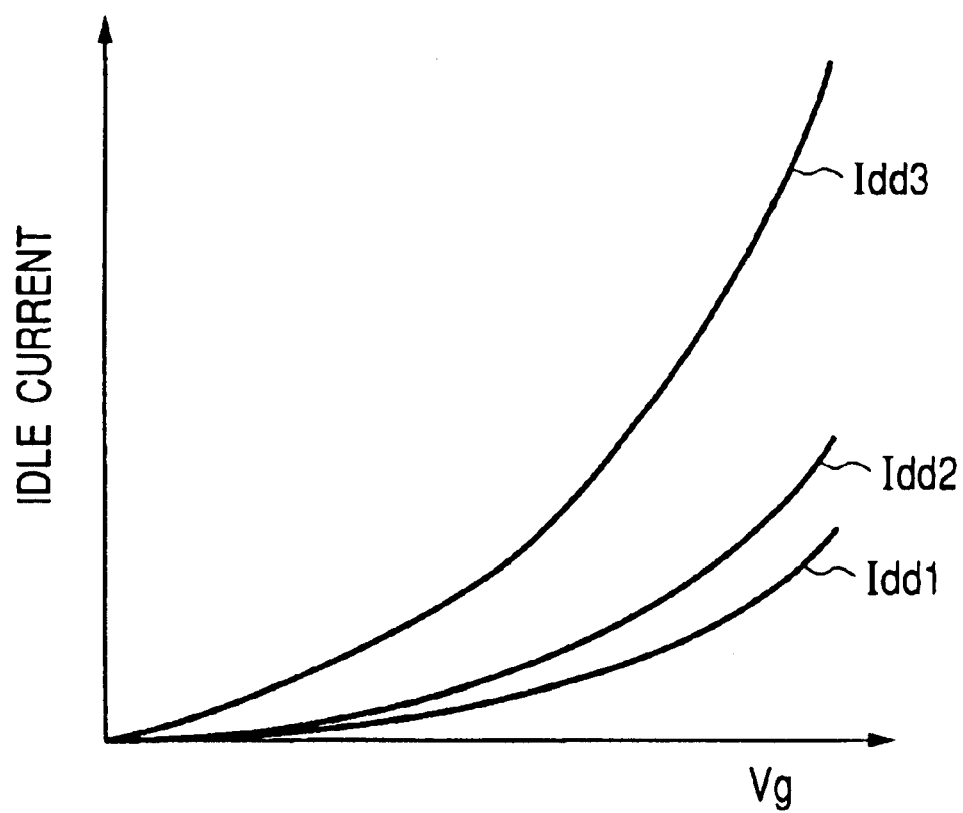
FIG. 10 is a graph showing the relation between gate bias voltages in the conventional high frequency power amplification circuit and the bias generating circuit and idle currents in the amplification stages.

In the conventional bias generating circuit including the resistors R11 to R19 as shown in FIG. 8, in which voltage at a predetermined ratio obtained by dividing the output control voltage Vapc by a resistance ratio is applied to the gate terminals of the transistors Q1, Q2, and Q3 in the stages to thereby passing the idle current, when the ratio of the resistors R11 to R19 is set so as to pass the idle current to the transistors Q1, Q2, and Q3 for power amplification at a ratio optimum to obtain the maximum efficiency at the time of the maximum output power, since the ratio of idle currents in the stages varies according to the output level due to an influence of the AC component, the current flowing to the transistors Q1 and Q2 in the first and second stages decreases when the output power is small. Thus, distortion of a signal increases and the power efficiency deteriorates. In contrast, in the power amplifier using the bias generating circuit of the embodiment, when the output power is small, the current flowing to the transistors Q1 and Q2 in the first and second stages can be made relatively large.

Moreover, in the power amplifier using the conventional bias generating circuit including the resistors R11 to R19 as shown in FIG. 8, a voltage at a predetermined ratio obtained by dividing the output control voltage Vapc by a resistance ratio is applied to the gate terminals of the transistors Q1, Q2, and Q3 in the stages. Consequently, the ratio of the idle current of the transistors in the stages is deviated from the desired ratio due to variations in resistance. In the power amplifier using the bias generating circuit of the embodiment, the current flowing in the transistor Q1 in the first stage is detected and compared with the detected current in the final stage by the error amplifier ERA2 to thereby control the gate voltage. Thus, even if the resistance varies, the gate voltage can be accurately controlled so that the current ratio becomes a desired value.

Figure 2A:
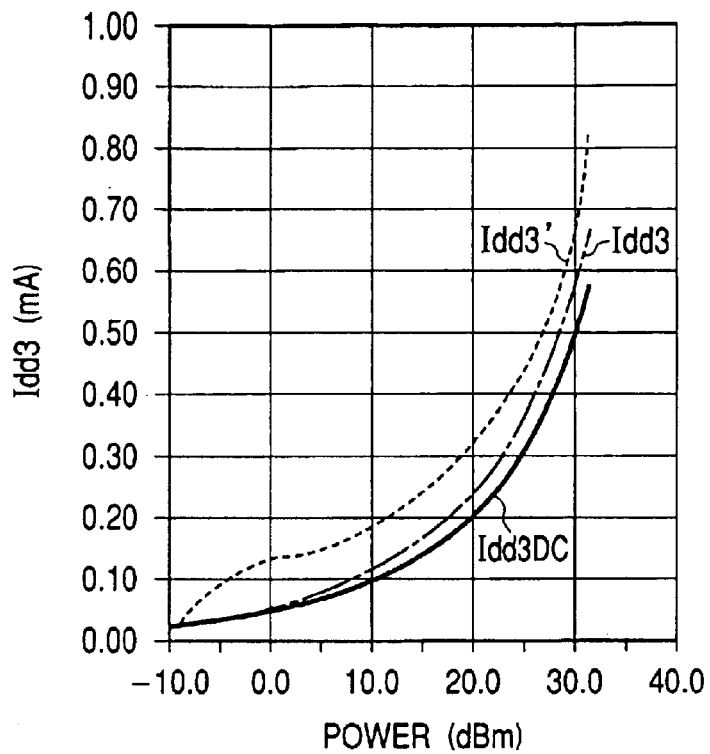
FIG. 2A is a graph showing the relation between output power and idle current Idd3 flowing in a transistor Q3 for amplification in the third stage.
Figure 2B:
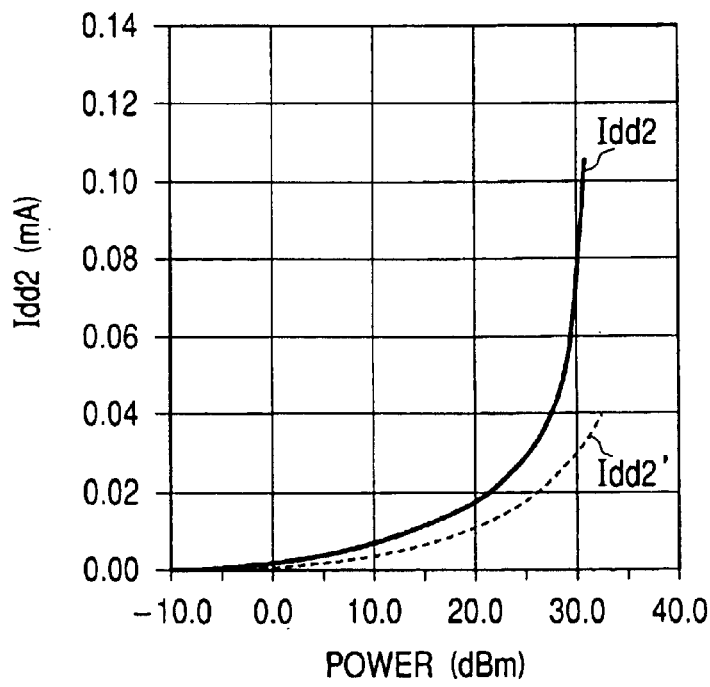
FIG. 2B is a graph showing the relation between output power and idle current Idd2 flowing in a transistor Q2 for amplification in the second stage.

FIGS. 2A and 2B show the idle currents Idd2 and Idd3 flowing in the transistors Q2 and Q3 in the second and third stages obtained by simulation both in the power amplifier using the bias generating circuit of the embodiment of FIG. 1 and in the power amplifier using the conventional bias generating circuit. The horizontal axis denotes output power. FIG. 2A shows the idle current Idd3 flowing in the transistor Q3 for amplification in the third stage. FIG. 2B shows the idle current Idd2 flowing in the transistor Q2 for amplification in the second stage. An alternate long and short dash line indicates the total idle current Idd3 including the AC component flowing in the transistor Q3 for amplification in the third stage of the power amplifier of the embodiment. The solid lines indicate the DC components of the idle currents Idd2 and Idd3 flowing in the transistors Q2 and Q3 for amplification in the second and third stages, respectively, of the power amplifier of the embodiment. The broken lines show the DC components of the idle currents Idd2 and Idd3 flowing in the transistors Q2 and Q3 for amplification in the second and third stages, respectively, in the conventional power amplifier. Although not shown, the idle current flowing in the transistor Q1 for amplification in the first stage of the power amplifier of the embodiment indicates similar tendency though it is slightly smaller than the idle current flowing in the transistor Q2 for amplification in the second stage.

It is understood from FIG. 2A that the idle current Idd3 flowing in the transistor Q3 for amplification in the third stage of the power amplification of the embodiment is smaller than the idle current Idd3' flowing in the transistor Q3 for amplification in the third stage of the conventional power amplifier. It is understood from FIG. 2B that the idle current Idd2 flowing in the transistor Q2 for amplification in the second stage of the power amplifier of the embodiment is larger than the idle current Idd2' flowing in the transistor Q2 for amplification in the second stage of the conventional power amplifier. That is, by applying the embodiment, the idle current Idd3 flowing in the transistor Q3 for amplification in the final stage can be decreased, and the idle currents Idd1 and Idd2 flowing in the transistors Q2 and Q3 for amplification in the first and second stages can be increased.

In the embodiment of FIG. 1, a resistor having a resistance value of about 10 Ω is used as the resistor R6 connected between the gate terminal of the transistor Q1 for amplification in the first stage and the gate terminal of the transistor Q8. Therefore, the error amplifier ERA2 can detect the input level including the AC component in the input of the transistor Q1 for amplification in the first stage, compare the detected level with the detected level including the AC component in the input in the final stage of the output level detection circuit ODT1, and control the idle current of the transistor Q1. In such a manner, the idle current control with high precision can be realized.

However, the AC components included in inputs of the transistors Q1 and Q2 in the first and second stages are much smaller as compared with the AC component included in an input of the transistor Q3 in the final stage. Therefore, even if the AC component is cut by using a resistor having a resistance value of 100 Ω or larger as the resistor R6, precision of the control on the idle currents of the transistors Q1 and Q2 in the first and second stages does not deteriorate so much. Even in a region of a high output power level, an influence on distortion of a signal and power efficiency is little. Rather, by cutting the AC component with the resistor R6, idle currents of the transistors Q1 and Q2 in the first and second stages are increased in the region of a low output power level, distortion of a signal is further reduced, and power efficiency can be improved.

In the case of cutting the AC component with the resistor R6, although distortion of a signal occurs in a region of a high output power level and power efficiency slightly deteriorates as compared with the case of passing the AC component, distortion of a signal in a region of a low output power level is reduced, and power efficiency can be improved. It is therefore sufficient to determine the value of the resistor R6 according to importance placed on either performance in the low output power region or performance in the high output power region. In the embodiment of FIG. 1, the levels of inputs of the transistors Q1 and Q2 for amplification are detected via the resistors R6 and R7 and the bias voltage is applied to the gate terminals of the transistors Q1 and Q2 via the resistors R6 and R7. Alternately, a resistor (R10 in FIG. 5) corresponding to the resistor R1 in the final stage may be provided in addition to the resistors R6 and R7 to separate a detection path and a bias application path from each other.

In the embodiment of FIG. 1, the resistor R3 is connected between the drain terminal of the transistor Q4 for output level detection as a component of the output level detection circuit and the drain terminal of the MOSFET Q5 for a current mirror. However, the resistor R3 can be omitted. By providing the resistor R3, the power source voltage dependency of the output level detection circuit ODT1 can be reduced. The correlation between the output power Pout and the detected current in the case where the resistor Rr3 for improving linearity is not provided is almost linear when the power source voltage Vdd is at a predetermined level of, for example, 3.5V. However, when the power source voltage Vdd changes to a level such as 4.2V, the current flowing in the transistor Q4 for output level detection sharply increases in a region of high output power. When the resistor R3 is provided, a fluctuation amount of the drain voltage of the transistor Q4 is reduced even when the power source voltage Vdd changes. As a result, fluctuation in the current flowing in the transistor Q4 can be reduced. A proper resistance value of the resistor R3 for improving linearity is, for example, about 100 Ω.

Figure 3:
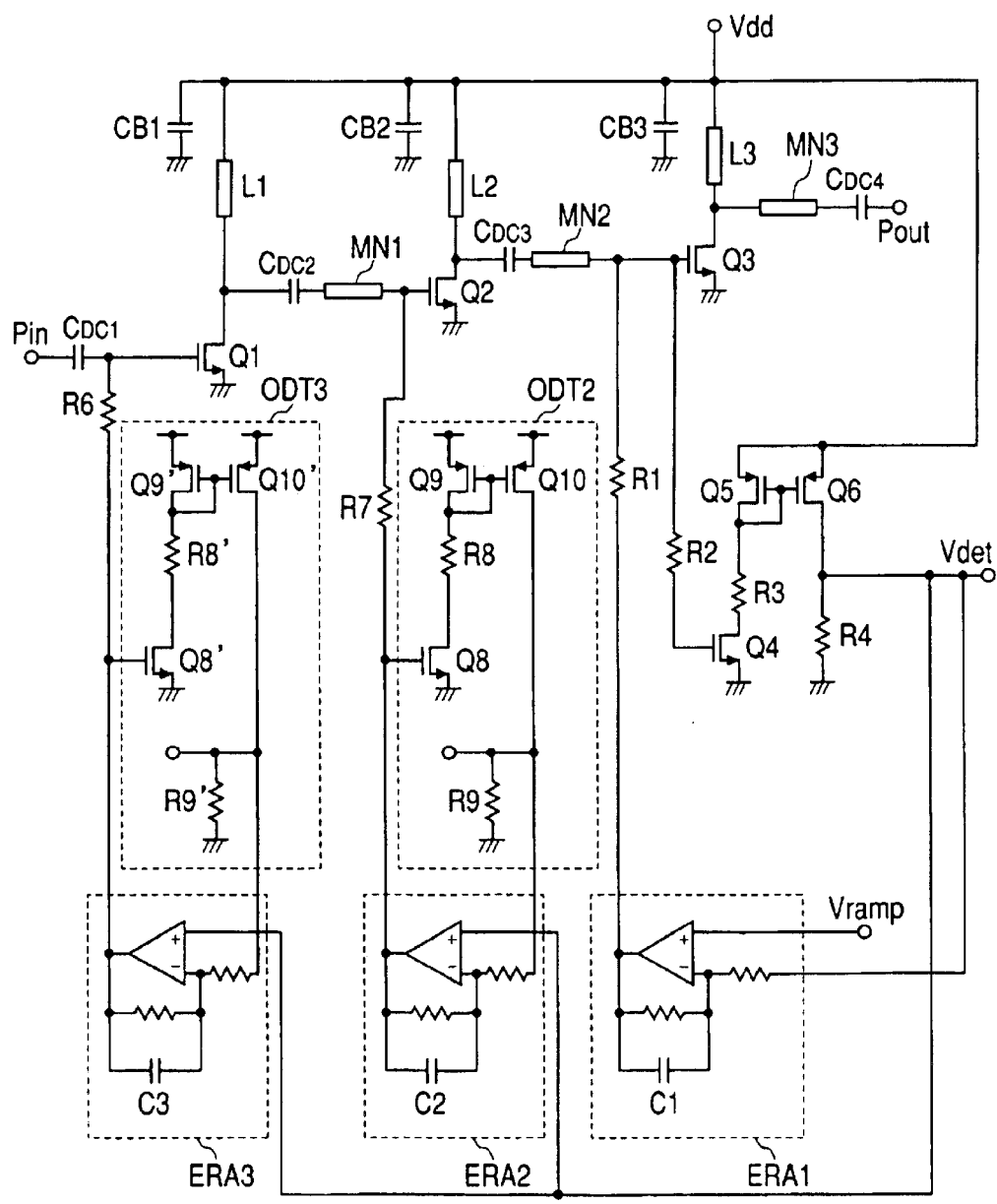
FIG. 3 is a circuit diagram showing a first modification of the first embodiment.

FIG. 3 shows a first modification of the embodiment of FIG. 1. According to the modification, in the embodiment of FIG. 1, in place of providing the common error amplifier ERA2 for applying a bias to the transistors Q1 and Q2 for power amplification in the first and second stages, error amplifiers ERA2 and ERA3 for applying biases to the transistors Q1 and Q2, respectively and detection circuits ODT2 and ODT3 are provided. A detection level of the detection circuit ODT2 is input to the inversion input terminal of the error amplifier ERA2, a detection level of the detection circuit ODT3 is input to the inversion input terminal of the error amplifier ERA3, the detection levels are compared with the detection level of the final stage, and idle current is made to flow according to the potential difference. According to the modification, the idle currents Idd1 and Idd2 of the transistors Q1 and Q2 for power amplification in the first and second stages can be controlled separately. Therefore, also in the case where variations in the transistors Q1 and Q2 are different from each other, the idle currents Idd1 and Idd2 of the transistors Q1 and Q2 can be controlled so as to compensate each of the variations.

In the embodiment of FIG. 1, the transistor Q7 and the resistor R5 to which current proportional to the current of the sense resistor R4 is made to flow are provided, and a voltage converted by the resistor R5 is applied to a non-inversion input terminal of the error amplifier ERA2. In the modification of FIG. 3, the voltage converted by the sense resistor R4 input to the inversion input terminal of the error amplifier ERA1 is input to the non-inversion input terminals of the error amplifiers ERA2 and ERA3. With the configuration, as compared with the embodiment of FIG. 1, the number of devices can be reduced.

Like the embodiment of FIG. 1, it is also possible to provide the transistor Q7 and the resistor R5 to which the current proportional to the current of the sense resistor R4 flows and to apply the voltage converted by the resistor R5 to the non-inversion input terminals of the error amplifiers ERA2 and ERA3. By providing the transistor Q7 and the resistor R5, the current ratio of the idle currents of the transistors Q1, Q2, and Q3 for power amplification can be set without changing the ratio of the transistors constructing the detection circuits ODT1 to ODT3. Further, it is also possible to provide one more set of a transistor and a resistor corresponding to the transistor Q7 and the resistor R5 and supply another potential to the non-inversion input terminals of the error amplifiers ERA2 and ERA3. In a manner similar to the embodiment of FIG. 1, a resistor corresponding to the resistor R1 in the final stage may be provided in addition to the resistors R6 and R7, thereby separately providing a detection path and a bias applying path.

Figure 4:
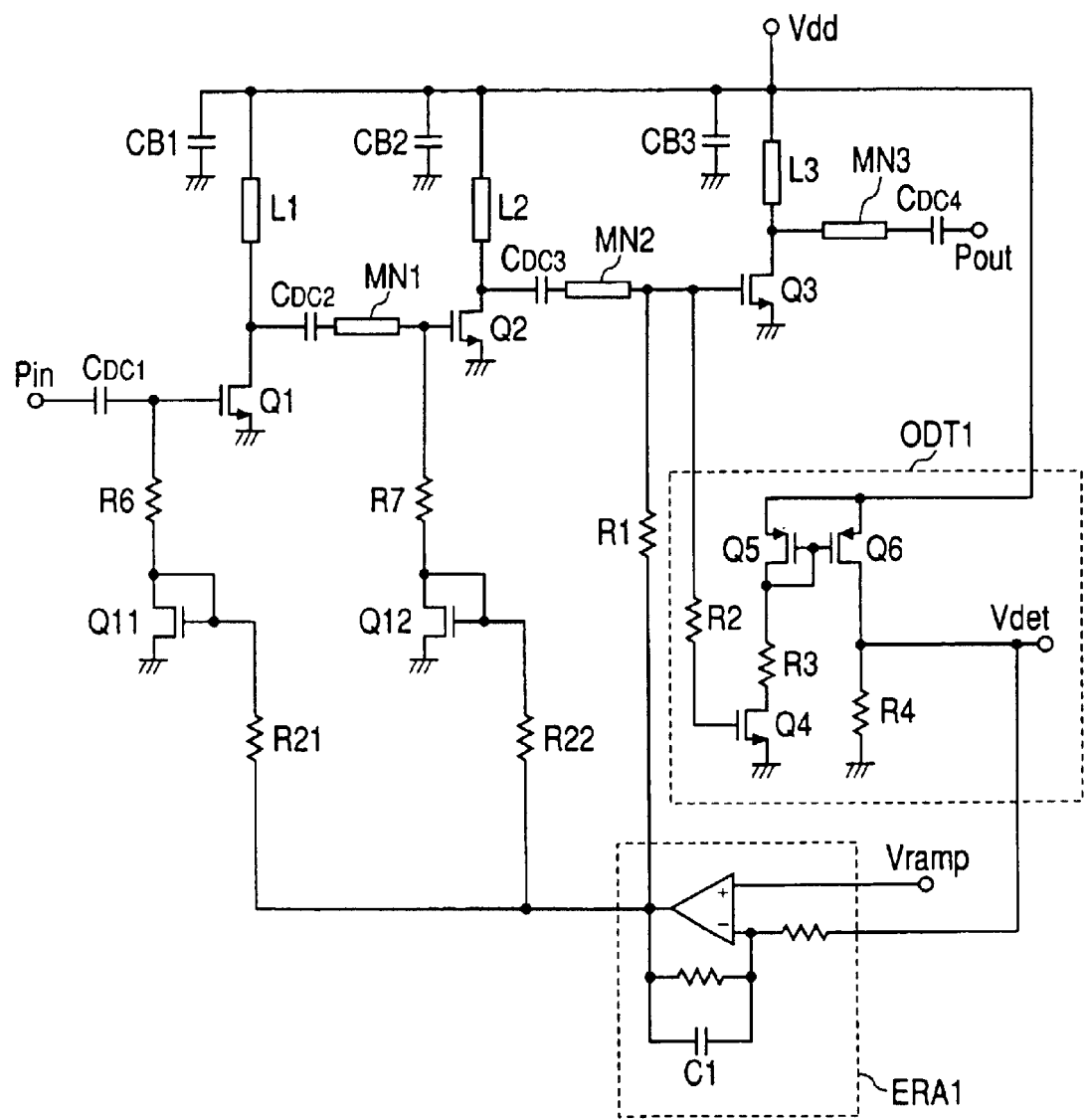
FIG. 4 is a circuit diagram showing a second modification of the first embodiment.

FIG. 4 shows a second modification of the embodiment of FIG. 1. According to the modification, the error amplifier ERA2 and the transistors Q8 to Q10 for input level detection in FIG. 1 are omitted, but transistors Q11 and Q12 constructing current mirrors with the transistors Q1 and Q2 for power amplification, respectively, are provided. An output voltage of the error amplifier ERA1 for applying gate bias to the transistor Q3 for application in the final stage in accordance with the detection level of the output level detection circuit ODT is applied to the gate terminals of the current mirror transistors Q11 and Q12 via resistors R21 and R22 to pass current to the transistors Q11 and Q12. The idle currents Idd1 and Idd2 proportional to the currents of the transistors Q11 and Q12 are made to flow to the transistors Q1 and Q2 for power amplification. Also in the circuit having such a configuration, by using a resistance value of 100 Ω or less as the resistance value of the resistor R2, the output level of the transistor Q3 for amplification in the final stage, which includes the AC component can be detected. According to the result of detection, the idle currents in the stages can be controlled.

Figure 5:
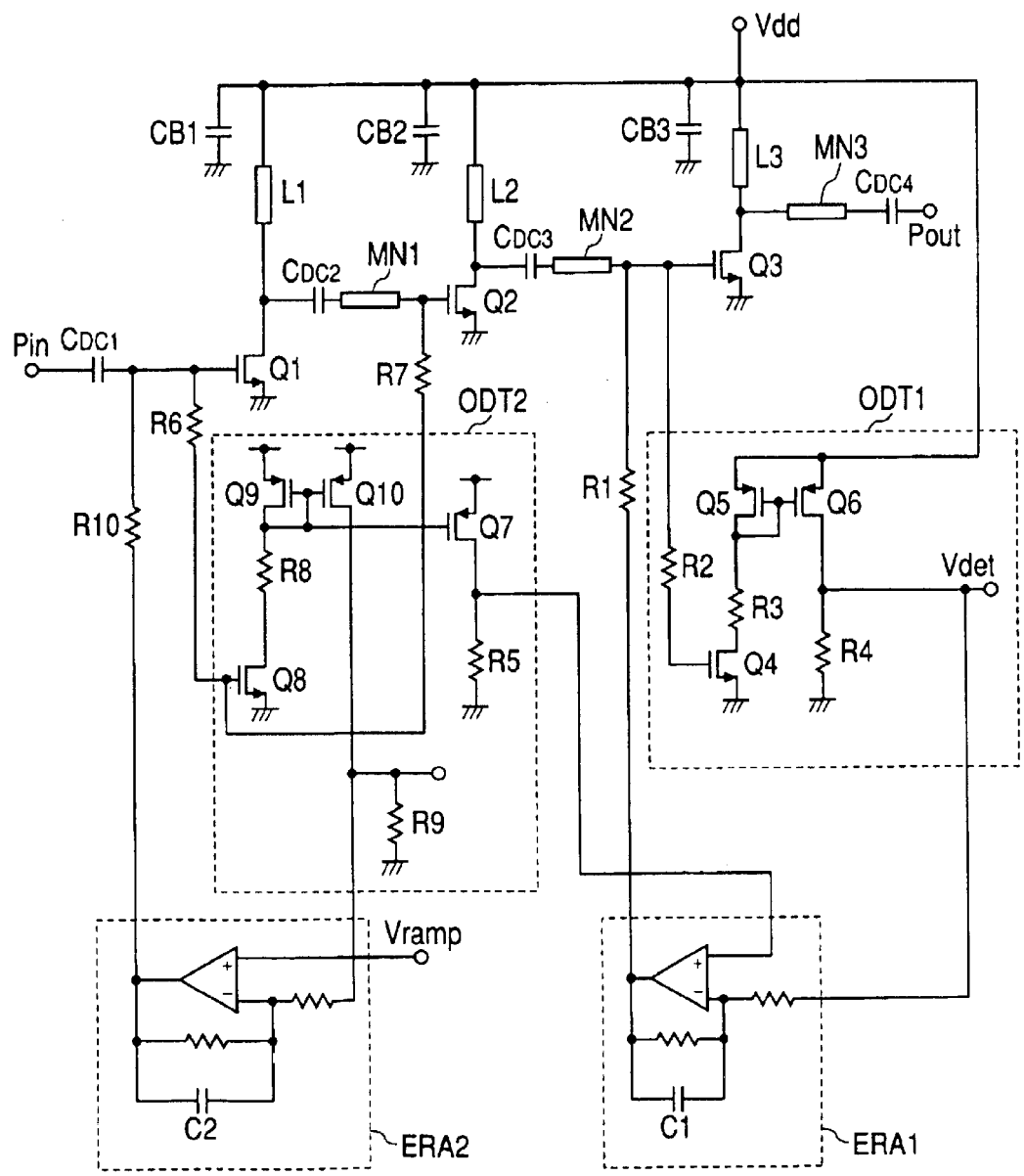
FIG. 5 is a circuit diagram showing a second embodiment of the high frequency power amplifier and the bias generating circuit to which the invention is applied.

FIG. 5 shows a second embodiment of the high frequency power amplifier and the bias generating circuit to which the invention is applied. In the second embodiment, the output level control voltage Vramp applied to the non-inversion input terminal of the error amplifier ERA1 in the first embodiment of FIG. 1 is applied to the non-inversion input terminal of the error amplifier ERA2, the current mirror transistor Q7 in the detection circuit ODT1 in the final stage and the resistor R5 for current-voltage conversion are provided for the detection circuit ODT2 for amplification stage in the first and second stages. A voltage converted by the resistor R5 of the detection circuit ODT2 is input to the non-inversion input terminal of the error amplifier ERA1. In addition to the resistor R6 provided between the gate of the transistor Q1 for power amplification and the gate of the transistor Q8 for detection, a resistor R10 corresponding to the resistor R1 in the final stage is provided and an output of the error amplifier ERA2 is fed back to the gate terminal of the transistor Q1 for power amplification via the resistor R10, thereby separately providing a detection path and a bias applying path.

In the embodiment, the gate input level of the transistor Q1 for power amplification in the first stage is detected by including the AC component. The detected level and the output level control voltage Vramp are compared with each other by the error amplifier ERA2. A bias according to the potential difference is applied to the transistors Q1 and Q2 for power amplification in the first and second stages. The detected level of the detection circuit ODT2 is supplied to the error amplifier ERA1 as a reference voltage and is compared with the detection level of the output level detection circuit ODT1. A bias according to the potential difference is applied to the transistor Q3 for amplification in the final stage, thereby passing current proportional to the idle current of the transistors Q1 and Q2 to the transistor Q3 for amplification in the final stage. The power amplifier of the embodiment has actions and effects similar to those of the power amplifier of the first embodiment of FIG. 1. The value of the output level control voltage Vramp supplied from the CPU in the first embodiment and that in the second embodiment are different from each other.

Figure 6:
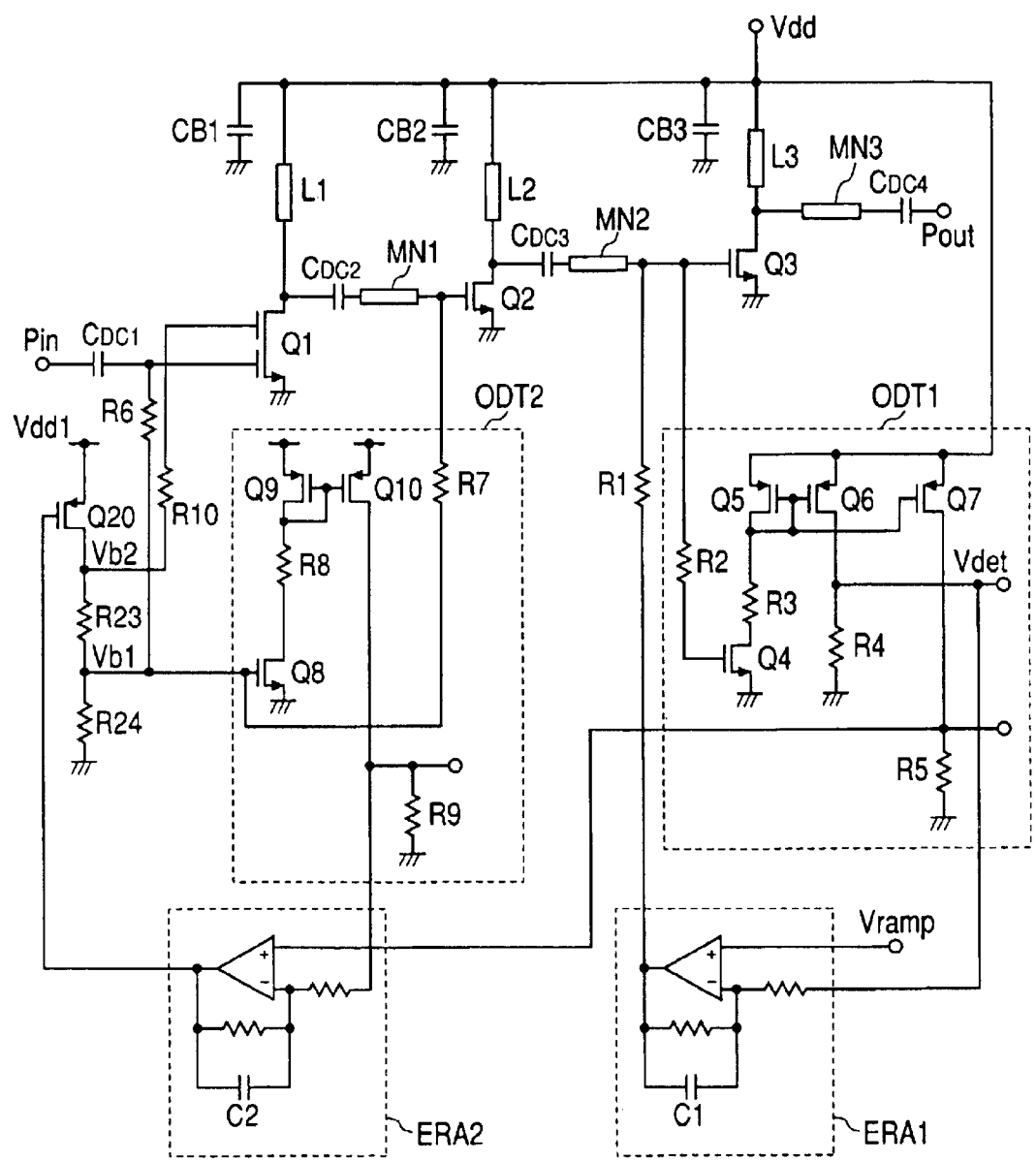
FIG. 6 is a circuit diagram showing a third embodiment of the high frequency power amplifier and the bias generating circuit to which the invention is applied.

FIG. 6 shows a third embodiment of the high frequency power amplifier and the bias generating circuit to which the invention is applied. The third embodiment is similar to the first embodiment of FIG. 1 except that a dual gate EFT is used as the transistor Q1 for power amplification in the first stage, and a transistor Q20 for passing current according to an output voltage of the error amplifier ERA2 and resistors R23 and R24 connected in series with the transistor Q20 are provided. To the first gate (gate on the ground side) of the dual gate EFT, the input high frequency signal Pin is supplied, and voltages Vb1 and Vb2 obtained by resistive division with the resistors R23 and R24 are applied as bias voltages to the first and second gates, respectively, of the transistor Q1 via the resistors R6 and R10. The dual gate EFT denotes here a field effect transistor in which two gate electrodes are provided in series between the drain region and the source region in correspondence with one channel region.

The power amplifier of the third embodiment produces the effects produced by the power amplifier of the first embodiment and, in addition, the following effects. By creating a biased state which enables the transistor for amplification in the first stage to continuously have a linear characteristic by the first bias voltage Vb1 and suppressing the gain of the transistor for amplification in the first stage by the second bias voltage Vb2, the gain at the time of allowing the high frequency power amplifier to operate linearly can be decreased.

With the configuration, by properly controlling the voltages of the two gates, the gain can be decreased without deteriorating the A-class amplification characteristic, that is, linearity of the FET. As a result, in a radio telecommunication system in which a power amplifier has to operate linearly like in an EDGE (Enhanced Data Rates for GMS Evolution) mode and the CDMA (Code Division Multiple Access) method, it can be avoided that the gain of a transistor for amplification in the first stage becomes too high and a reception band noise does not satisfy specifications.

Although not limited, the power amplifier and the bias generating circuit of each of the foregoing embodiments are constructed as a single module. In the specification, a configuration in which a plurality of electronic parts are mounted on an insulating substrate such as a ceramic substrate on/in which print wiring is conducted and the parts are connected via the print wiring and bonding wires so as to play a predetermined role, so that the parts can be dealt as one electronic part is called a module.

Concretely, for example, in the circuit of the embodiment of FIG. 1, one semiconductor integrated circuit is constructed by the transistors Q1 and Q2 for amplification in the first and second stages, the detection circuit ODT2 (excluding the resistor R9), the error amplifier ERA2, and the resistor R6. Another semiconductor integrated circuit is constructed by the output level detection circuit ODT1 (excluding the resistors R4 and R5), the error amplifier ERA1, and the resistors R1 and R2. The transistor Q3 for amplification in the final stage serves as an independent semiconductor device. The resistors R4, R5, and R9 and inductances L1 to L3 are constructed by discrete parts. The semiconductor integrated circuits, the semiconductor device, and the external parts are mounted on an insulating substrate such as a ceramic substrate, thereby obtaining a power module.

The capacitive elements CDC1 to CDC4 for cutting direct current as components of a circuit are constructed as discrete parts or conductive layers formed on the surface and rear surface of any of a plurality of dielectric layers stacked as a module board. Transmission lines as components of the impedance matching circuits MN1 to MN3 are formed by conductive layers made of copper or the like formed on the surface of the module board. In the embodiment, external resistors are used as the resistors R4, R5, and R9 since relatively high precision is required. Alternately, the resistors R4, R5, and R9 may be formed on the chip of a semiconductor integrated circuit in which the detection circuit ODT1 or ODT2 is formed.

Figure 7:
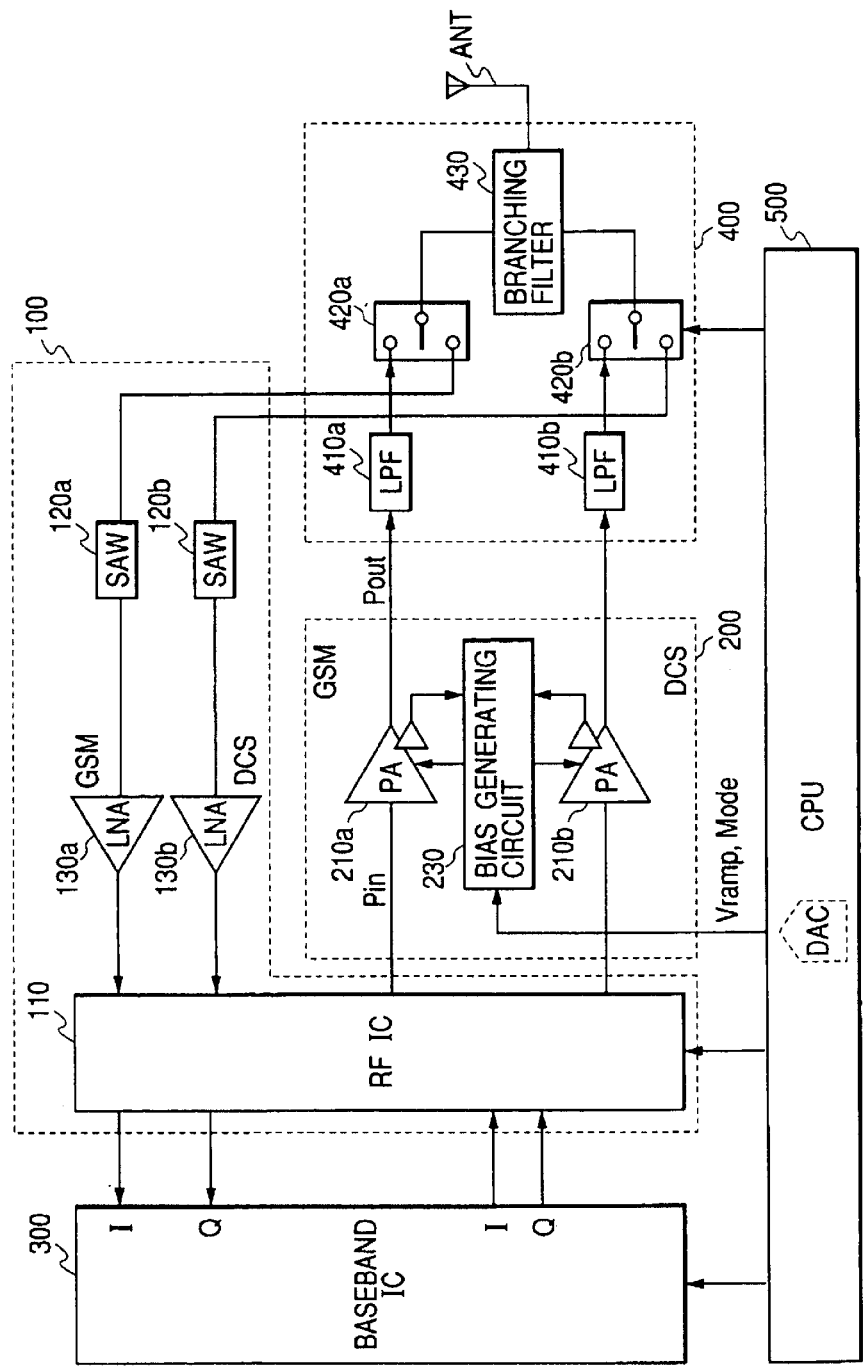
FIG. 7 is a block diagram showing a schematic configuration of a system capable of performing radio communications of two systems of GSM and DCS to which the invention is applied.

FIG. 7 shows a schematic configuration of a system capable of performing radio communication in two communication systems of GSM and DCS as an example of the radio telecommunication system using the high frequency power amplifier to which the invention is applied.

In FIG. 7, reference numeral 100 denotes a high frequency module (hereinbelow, called RF module) obtained by mounting, on a ceramic substrate, a high frequency signal processing circuit (RF IC) 110 formed as a semiconductor integrated circuit having a modem circuit capable of performing GMSK modulation and demodulation in GSM and DCS systems, a banspass filter SAW which is a surface acoustic wave filter for removing unnecessary waves from a reception signal, a low noise amplifier LNA for amplifying a reception signal, and the like. Reference numeral 200 denotes a high frequency power amplification module (power module) 200 including an IC, an external resistor, a capacitor, and the like constructing a power amplifier 210 having a configuration as shown in the foregoing embodiments and a bias generating circuit 230 for applying a bias. A bias generating circuit constructed by the output level detection circuit ODT1, error amplifiers ERAL and ERA2, resistors, and the like of FIG. 1 is expressed by one block 230 in FIG. 7.

Reference numeral 300 denotes a baseband circuit (baseband IC) formed as a semiconductor integrated circuit for generating I and Q signals on the basis of transmission data (baseband signal) and processing the I and Q signals extracted from a reception signal. Reference numeral 400 denotes a front end module including a filter LPF for eliminating noise such as harmonics included in a transmission signal output from the RF power module 200, a transmission/reception change-over switch, and a branching filter. Reference numeral 500 denotes a microprocessor (CPU) for controlling the whole system by generating control signals to the RF IC 110 and the baseband IC 300 and generating a signal Vramp indicative of an output level to the power module 200.

As shown in FIG. 7, in the embodiment, the power module 200 has therein a power amplifier 210a for amplifying a transmission signal of 900 MHz in a frequency band of GSM, and a power amplifier 210b for amplifying a transmission signal of 1800 MHz in a frequency band of DCS. Similarly, the RF module 100 has therein an SAW filter 120a and a low noise amplifier 130a for GSM, and an SAW filter 120b and a low noise amplifier 130b for DCS.

In the RF IC 110, GMSK modulation for phase-modulating carrier waves in accordance with information to be transmitted is performed. The phase-modulated signal is input as the high frequency signal Pin to the power module 200 and amplified. Although not particularly limited, in the embodiment, the RF IC 110 includes not only a modulation circuit for transmission but also a reception circuit constructed by a mixer for down-converting a reception signal to a lower-frequency signal, a high-gain programmable gain amplifier, and the like. The low noise amplifier LNA can be provided in the RF IC 110.

The front end module 400 has a low pass filter 410a for GSM, a low pass filter 410b for DCS, a change-over switch 420a for switching between transmission and reception of GSM, a change-over switch 420*b* for switching between transmission and reception of DCS, and a branching filter 430 connected to the antenna ANT, for branching a signal for GSM and a signal for DCS from a reception signal. Although not shown in FIG. 8, the power module 200 or front end module 400 has an impedance matching circuit for matching impedances, which is connected between the output terminals of the power amplifiers 210*a* and 210*b* or the transmission output terminals of the RF power module 200 and the low pass filters 410*a* and 410*b*.

In the dual-band communication system of GSM and DCS, the maximum level of output power of the power amplifier 210*a* on the GSM side and the maximum level of output power of the power amplifier 210*b* on the DCS side are specified according to standards and are different from each other. By properly setting each of the size ratio between the transistor Q3 for high frequency power amplification and the transistor Q4 for output level detection and the size ratio between the transistors Q5 and Q6 constructing the current mirror circuit, the resistors R4 and R5 and the error amplifiers ERA1 and ERA2 can be shared by the two bands.

Although the invention achieved by the inventor herein has been concretely described on the basis of the embodiments, obviously, the invention is not limited to the foregoing embodiments but can be variously modified without departing from the gist. For example, in the high frequency power amplifier of the foregoing embodiments, the power amplifiers FET are connected in three stages. The power amplifiers FET may be connected in two stages or four or more stages.

The case of applying the invention achieved by the inventor herein to the high frequency power module as a component of a radio telecommunication system capable of transmitting and receiving information in accordance with a communication system such as GSM or DCS in the field of utilization as the background of the invention has been described. However, the invention is not limited to the case and can be used for a high frequency power module as a component of a radio telecommunication system such as a portable telephone or a mobile telephone of a multimode capable of performing transmission and reception according to another communication system or three or more communication systems such as GMS, DCS, and PCS (Personal Communications System).

Effects obtained by a representative one of the inventions disclosed in the application will be briefly described as follows.

According to the invention, in the high frequency power amplifier of a multistage configuration in which a plurality of transistors for power amplification are cascaded, not only a DC component but also an AC component of a signal which is input to the gate of the transistor for power amplification in the final stage are transmitted to the gate terminal of the transistor for output level detection. Thus, a signal including the AC component can be fed back. As compared with the case of detecting only a DC component and feeding it back, current flowing in the amplification stage on the first stage side can be increased in a region of a low output level. As a result, effects are produced such that distortion of a signal is reduced and power efficiency is improved.

An error amplifier is provided, which is different from the error amplifier for applying a bias to the gate of the transistor for power amplification in the final stage in accordance with an output level. The output voltage of the error amplifier for the final stage is input as a reference voltage to the error amplifier. The gate input voltage of a transistor for power amplification in a preceding stage is input as another comparison voltage to the error amplifier. A voltage according to the potential difference is fed back to the gate input side of the transistor for power amplification in the preceding stage. With the configuration, accurate idle current proportional to the idle current of the transistor for power amplification in the final stage is made to flow to the transistor for power amplification in the preceding stage irrespective of variations in manufacture.

What is claimed is:

1. A high frequency power amplifier electric part comprising:

a power amplification circuit of a multi-stage configuration in which a plurality of transistors for amplification are cascaded, which amplifies an input high frequency signal and outputs the amplified signal;

a transistor for output level detection, which receives an input signal of a transistor for amplification in the final stage of the power amplification circuit; and a bias generating circuit for applying a bias to said power amplification circuit in accordance with current of the transistor for output level detection, wherein said bias generating circuit includes:

a resistive element connected between an input terminal of said transistor for amplification in the final stage and an input terminal of said transistor for output level detection;

a current-voltage converting means for converting current detected by said transistor for output level detection into a voltage; and an error amplifier for outputting voltage according to a potential difference between the voltage converted by the current-voltage converting means and voltage instructing an output level from the outside, a resistance value of said resistive element is set to a value so that an AC component of an input signal of said transistor for amplification can be transmitted, said transistor for output level detection passes current according to a DC component and an AC component of an input signal of said transistor for amplification in the final stage, and an output of said error amplifier is fed back to an input side of said transistor for amplification in the final stage.

2. The high frequency power amplifier electric part according to claim 1, wherein the resistance value of said resistive element is 100 Ω or less.

3. The high frequency power amplifier electric part according to claim 1, wherein an output of said error amplifier is fed back to an input side of said transistor for amplification in the final stage via a second resistive element.

4. The high frequency power amplifier electric part according to claim 1, wherein said bias generating circuit comprises:

a transistor for detection for receiving an input signal of a transistor for amplification in a stage preceding the final stage;

second current-voltage converting means for converting current of the transistor for detection; and a second error amplifier for outputting voltage according to a potential difference between the voltage obtained by the conversion of the second current-voltage converting means and reference voltage, and wherein an output of the second error amplifier is fed back to the input side of the transistor for amplification in a stage preceding the final stage.

5. The high frequency power amplifier electric part according to claim 4, wherein the voltage obtained by conversion of said current-voltage converting means is applied as said reference voltage to said second error amplifier.

6. The high frequency power amplifier electric part according to claim 4, further comprising a current mirror circuit for passing current proportional to current of said transistor for output level detection, wherein the current mirror circuit has a first transistor for generating a first transfer current and a second transistor for generating a second transfer current, wherein the voltage obtained by converting said first transfer current by said current-voltage converting means is applied to said error amplifier, and wherein the voltage obtained by converting said second transfer current by said current-voltage converting means is applied as a reference voltage to said second error amplifier.

7. The high frequency power amplifier electric part according to claim 1, wherein said power amplifier is constructed by cascading three or more transistors for amplification, and wherein, in correspondence with each of the transistors for amplification, there are provided:

a transistor for detection which receives an input signal via a resistive element;

a current mirror circuit for passing current proportional to current of the transistor;

current-voltage converting means for converting current transferred from the current mirror circuit to voltage; and an error amplifier for outputting voltage according to a potential difference between voltage obtained by conversion of the current-voltage converting means and a reference voltage and feeding back the output to an input side of the corresponding transistor for amplification.

8. The high frequency power amplifier electric part according to claim 4, wherein the transistor for amplification in the first stage of said power amplifier is a field effect transistor in which two gate electrodes are provided in series between a drain region and a source region in correspondence with one channel region and has a resistor dividing circuit for passing current according to an output of said second error amplifier, and wherein first voltage generated by the resistor dividing circuit is applied to the input side of the first gate electrode of said field effect transistor, and second voltage generated by said resistor dividing circuit is applied to the input side of the second gate electrode of said field effect transistor.

9. A high frequency power amplifier electric part comprising:

a power amplification circuit of a multi-stage configuration in which a plurality of transistors for amplification are cascaded, which amplifies an input high frequency signal and outputs the amplified signal; and a bias generating circuit for applying a bias to each of the transistors for amplification of the power amplification circuit, wherein said bias generating circuit includes:

a first transistor for detection, which receives an input signal of a transistor for amplification in the final stage via a first resistive element;

a first current-voltage converting means for converting current detected by the first transistor for detection into a voltage;

a first error amplifier for outputting voltage according to a potential difference between the voltage converted by the first current-voltage converting means and reference voltage;

a second transistor for detection, which receives an input signal of a transistor for amplification in a stage preceding the final stage via a second resistive element;

a second current-voltage converting means for converting current detected by the second transistor for detection into a voltage; and a second error amplifier for outputting voltage according to a potential difference between the voltage converted by the second current-voltage converting means and voltage indicative of an output level from the outside, wherein a resistance value of said second resistive element is set to a value so that an alternate current component of an input signal of said transistor for amplification in said preceding stage can be transmitted, wherein said second transistor for detection passes current according to a DC component and an AC component of an input signal of a transistor for amplification in said preceding stage, wherein an output of said second error amplifier is fed back to an input side of a transistor for amplification in a stage preceding the final stage, wherein the voltage converted by said second current-voltage converting means is applied as a reference voltage to said second error amplifier, and wherein an output of the first error amplifier is fed back to the input side of said transistor for amplification in the final stage.

10. The high frequency power amplifier electric part according to claim 9, further comprising a current mirror circuit for passing current proportional to current of said second transistor for detection, wherein the current mirror circuit comprise a first transistor for generating first transfer current, and a second transistor for generating second transfer current, wherein voltage obtained by converting said first transfer current by said second current-voltage converting means is applied to said second error amplifier, and wherein voltage obtained by converting said second transfer current by said current-voltage, converting means is applied as a reference voltage to said first error amplifier.

11. A radio telecommunication system comprising:

a high frequency power amplifier electric part according to claim 1;

a second electronic part having a transmission/reception switching circuit for switching between a transmission signal and a reception signal;

a third electronic part for modulating a signal to be transmitted and inputting the modulated signal to said high frequency power amplifier electronic part; and a semiconductor integrated circuit for applying voltage instructing an output level to said high frequency power amplifier electric part.

* * * * *